(12) United States Patent
Tsai

(10) Patent No.: US 8,970,255 B2
(45) Date of Patent: Mar. 3, 2015

(54) FREQUENCY DETECTION APPARATUS WITH INTERNAL OUTPUT VOLTAGE WHICH CHANGES ALONG WITH INPUT SIGNAL FREQUENCY

(71) Applicant: Realtek Semiconductor Corp., HsinChu (TW)

(72) Inventor: Tsung-Yen Tsai, Hsinchu County (TW)

(73) Assignee: Realtek Semiconductor Corp., Science Park, HsinChu (TW)

(*) Notice: Subject to any disclaimer, the term of this patent is extended or adjusted under 35 U.S.C. 154(b) by 0 days.

(21) Appl. No.: 14/267,889

(22) Filed: May 1, 2014

(65) Prior Publication Data
US 2014/0327472 A1    Nov. 6, 2014

(30) Foreign Application Priority Data
May 3, 2013  (TW) ............................... 102115981 A

(51) Int. Cl.
*G01R 23/02* (2006.01)
*H03K 5/26* (2006.01)
*G01R 23/06* (2006.01)

(52) U.S. Cl.
CPC *H03K 5/26* (2013.01); *G01R 23/02* (2013.01); *G01R 23/06* (2013.01)
USPC ............................... 327/47; 327/39; 327/102

(58) Field of Classification Search
CPC ............ H03K 5/26; G01R 23/06; G01R 23/09
USPC ............... 327/39, 40, 42, 47, 102; 324/76.39, 324/76.41
See application file for complete search history.

(56) References Cited

U.S. PATENT DOCUMENTS

| | | | | |
|---|---|---|---|---|
| 8,203,363 | B2 * | 6/2012 | Huang | 327/47 |
| 2001/0048299 | A1 * | 12/2001 | Farjad-Rad | 324/76.52 |
| 2002/0017926 | A1 * | 2/2002 | Saito | 327/39 |
| 2010/0052732 | A1 * | 3/2010 | Tokano | 327/47 |
| 2010/0219865 | A1 * | 9/2010 | Huang | 327/102 |

* cited by examiner

*Primary Examiner* — Patrick O'Neill
(74) *Attorney, Agent, or Firm* — Winston Hsu; Scott Margo

(57) ABSTRACT

A frequency detection apparatus includes: a constant current generator, arranged for providing a constant current to a voltage output terminal; a first capacitor, coupled between the voltage output terminal and a first reference voltage; a first transistor, which has a first connection terminal coupled to the voltage output terminal, a control terminal coupled to an input signal; a second connection terminal, coupled between the second connection terminal of the first transistor and the first reference voltage; a second transistor, which has a first connection terminal coupled to the second connection terminal of the first transistor, a second connection terminal coupled to the first reference voltage, a control terminal coupled to an inverted input signal, which is obtained by inverting the input signal; wherein a voltage output of the voltage output terminal changes with an input signal frequency of the input signal.

9 Claims, 2 Drawing Sheets

FREQUENCY DETECTION APPARATUS WITH INTERNAL OUTPUT VOLTAGE WHICH CHANGES ALONG WITH INPUT SIGNAL FREQUENCY

BACKGROUND OF THE INVENTION

1. Field of the Invention

The disclosed embodiments of the present invention relate to frequency detection, and more particularly, to a frequency detection apparatus with an internal output voltage which changes along with an input signal frequency of an input signal.

2. Description of the Prior Art

Power consumption in the normal operation mode and the standby mode of electronic devices needs to be taken care since the low power requirement is highly demanded in today's communication systems. Particularly, power management designs of portable devices now face new challenges regarding aspects of core and I/O voltages, power management, battery life, etc. A buck converter with synchronous rectification, which is widely applied in portable devices, provides a power saving mode to maintain high efficiency over the entire load range. The converter operates in a pulse frequency modulation (PFM) mode in a light load case, and switches to a pulse width modulation (PWM) mode automatically in a medium or heavy load case. The conventional architecture may need to detect voltage loads of components other than core components, for instance, I/O components; therefore, it consumes more power and has a larger die size. Hence, how to switch between PFM and PWM more efficiently has become an important issue in this field.

SUMMARY OF THE INVENTION

Therefore, one of the objectives of the present invention is to provide a frequency detection apparatus with an internal output voltage which changes along with an input signal frequency of an input signal, so as to allow the mode switching between PFM and PWM to be more efficient.

According to a first embodiment of the present invention, a frequency detection apparatus is disclosed. The frequency detection apparatus comprises a constant current generator, a first capacitor, a first transistor, a second capacitor, and a second transistor. The constant current generator is arranged for providing a constant current to a voltage output terminal; the first capacitor is coupled between the voltage output terminal and a first reference voltage; the first transistor has a first connection terminal, a control terminal, and a second connection terminal, wherein the first connection terminal is coupled to the voltage output terminal, and the control terminal is coupled to an input signal; the second capacitor is coupled between the second connection terminal of the first transistor and the first reference voltage; the second transistor has a first connection terminal, a control terminal, and a second connection terminal, wherein the first connection terminal of the second transistor is coupled to the second connection terminal of the first transistor, the second connection terminal of the second transistor is coupled to the first reference voltage, and the control terminal of the second transistor is coupled to an inverted input signal; wherein a voltage output of the voltage output terminal changes in pace with an input signal frequency of the input signal.

According to a second embodiment of the present invention, a frequency detection apparatus is disclosed. The frequency detection apparatus comprises a constant current generator and a frequency-voltage conversion unit. The constant current generator is arranged for providing a constant current to a voltage output terminal; and the frequency-voltage conversion unit is arranged for receiving an input signal, an inverted input signal and the constant current, and generating a voltage output at a voltage output terminal in accordance with the input signal, the inverted input signal and the constant current; wherein there is a predetermined proportion relationship between the voltage output and an input signal frequency of the input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
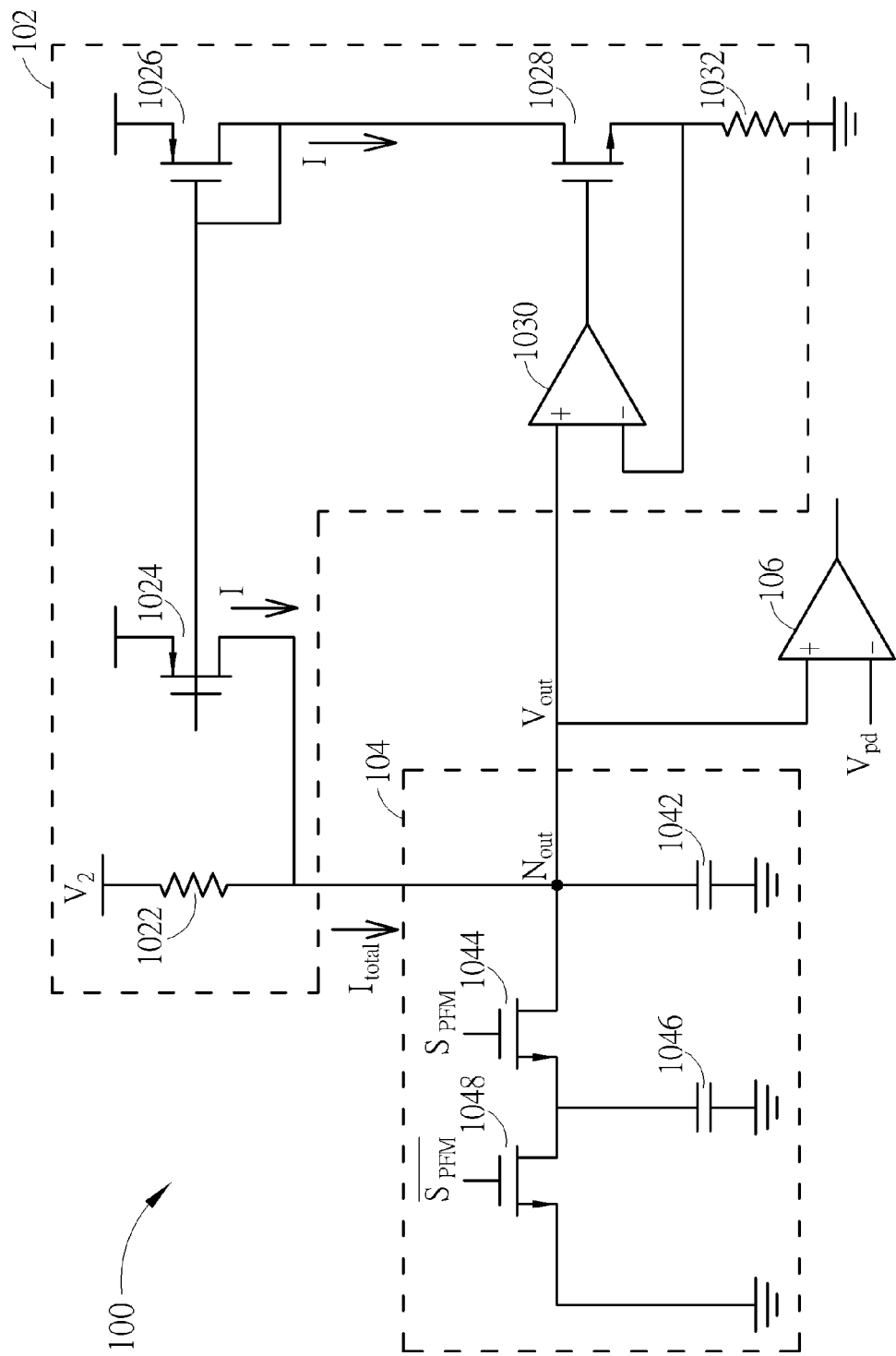
FIG. 1 is a diagram illustrating a frequency detection apparatus according to an embodiment of the present invention.

Please refer to FIG. 1, which is a diagram illustrating a frequency detection apparatus 100 according to an embodiment of the present invention. The frequency detection apparatus 100 includes a constant current generator 102, a frequency-voltage conversion unit 104 and a comparator 106. The constant current generator 102 is utilized to provide a constant current $I_{total}$ to a voltage output terminal $N_{out}$ of the frequency-voltage conversion unit 104. The frequency-voltage conversion unit 104 is utilized to receive an input signal $S_{PFM}$, an inverted input signal $\overline{S}_{PFM}$ and the constant current $I_{total}$, wherein the inverted input signal $\overline{S}_{PFM}$ is an inverted version of the input signal $S_{PFM}$. The frequency-voltage conversion unit 104 generates a voltage output $V_{out}$ at a voltage output terminal $N_{out}$ according to the input signal $S_{PFM}$, the inverted input signal $\overline{S}_{PFM}$ and the constant current $I_{total}$. The voltage output $V_{out}$ changes along with an input signal frequency f of the input signal $S_{PFM}$. The comparator 106 has a first input terminal (+) and a second input terminal (−), wherein the first input terminal (+) is coupled to the voltage output terminal $N_{out}$, and the second input terminal (−) is coupled to a predetermined voltage $V_{pd}$ corresponding to a predetermined frequency $f_{pd}$. The comparator 106 is utilized to determine whether the input signal frequency f of the input signal $S_{PFM}$ exceeds the predetermined frequency $f_{pd}$.

More specifically, the constant current generator 102 includes a first resistor 1022, a first transistor 1024, a second transistor 1026, a third transistor 1028, an amplifier 1030 and a second resistor 1032. The first resistor 1022 has a resistance value R and is coupled between a second reference voltage $V_2$ and the voltage output terminal $N_{out}$. The first transistor 1024 has a first connection terminal, a control terminal and a second connection terminal, wherein the first connection terminal is coupled to the voltage output terminal $N_{out}$, and the second connection terminal is coupled to the second reference voltage $V_2$. The second transistor 1026 has a first connection terminal, a control terminal and a second connection terminal, wherein the first connection terminal of the second transistor 1026 is coupled to the control terminal of the first transistor 1024 and the control terminal of the second transistor 1026, and the second connection terminal of the second transistor 1026 is coupled to the second reference voltage $V_2$. The third transistor 1028 has a first connection, a control terminal and a second connection terminal, wherein the first connection terminal of the third transistor 1028 is coupled to the first connection terminal of the second transistor 1026. The amplifier 1030 has a positive input terminal (+), a negative input terminal (−) and an output terminal, wherein the positive terminal (+) is coupled to the voltage output terminal, the negative input terminal (−) is coupled to the second connection terminal of the third transistor 1028, and the output terminal is coupled to the control terminal of the third transistor 1028. The second resistor 1032 may have a resistance value R the same as that of the first resistor 1022, and the second resistor 1032 is coupled between the second connection terminal of the third transistor 1028 and the first reference voltage $V_1$ (the first reference voltage $V_1$ may be a ground voltage in this embodiment). It should be noted that, in practice, the transistors in this embodiment may be replaced with any other designs which are able to achieve functions similar to switches, and these alternative designs all fall within the scope of the present invention. For instance, the transistors in this embodiment may be Metal-Oxide-Semiconductor Field-Effect Transistors (MOSFETs), and the first connection terminal, the control terminal and the second connection terminal of each transistor may be a drain terminal, a gate terminal, and a source terminal, respectively.

The output terminal of the amplifier 1030 is coupled to the control terminal of the third transistor 1028. The positive input terminal (+) of the amplifier 1030 receives the voltage output $V_{out}$ generated by the voltage output terminal $N_{out}$. The negative input terminal (−) of the amplifier 1030 outputs an output voltage $V_{out}$ and is coupled to the register 1032, such that the voltage output $V_{out}$ is converted into a control current I through the register 1032

$$\left(\text{i.e. } I = \frac{V_{out}}{R}\right).$$

In addition, the transistor 1024 and the transistor 1026 in this embodiment may have the same aspect ratio; therefore, the transistor 1024 will obtain a current the same as the control current I flowing through the transistor 1026 due to a current mirror. The constant current generator 102 provides the constant current $I_{total}$ to the voltage output terminal of the frequency-voltage conversion unit 104. Hence, the overall constant current $I_{total}$ may be expressed as:

$$I_{total} = \frac{V_{out}}{R} + \frac{V_2 - V_{out}}{R} = \frac{V_2}{R} \tag{1}$$

That is to say, the constant current $I_{total}$ has a fixed current value, and is not affected by the voltage output $V_{out}$ of the voltage output terminal $N_{out}$ of the frequency-voltage conversion unit 104. It should be noted that the operations of the constant current generator 102 are not detailed in the present invention due to the fact that those skilled in this field should readily understand the principles of the constant current generator 102 after referring to the descriptions set forth and the equation (1). Therefore, the details of the constant current generator 102 are omitted here for brevity. In addition, the design of the constant current generator 102 (e.g. the aspect ratios of the transistors 1024 and 1026) is for illustrative purpose only. In practice, any alternative designs that achieve the same objective all fall within the scope of the present invention.

The frequency-voltage conversion unit 104 includes a first capacitor 1042, a first transistor 1044, a second capacitor 1046 and a second transistor 1048. The first capacitor 1042 has a capacitance $C_1$, and is coupled between the voltage output terminal $N_{out}$ and the first reference voltage $V_1$. The first transistor 1044 has a first connection terminal, a control terminal and a second connection terminal, wherein the first connection terminal is coupled to the voltage output terminal $N_{out}$, and the control terminal is coupled to the input signal $S_{PFM}$. The second capacitor 1046 has a capacitance $C_2$, and is coupled between the second connection terminal of the first transistor and the first reference voltage $V_1$. The second transistor 1048 has a first connection terminal, a control terminal and a second connection terminal, wherein the first connection terminal of the second transistor 1048 is coupled to the second connection terminal of the first transistor 1044, the second connection terminal of the second transistor 1048 is coupled to the first reference voltage $V_1$, and the control terminal of the second transistor 1048 is coupled to the inverted input signal $\overline{S}_{PFM}$. In this embodiment, the input signal $S_{PFM}$ is an output signal generated via PFM and having a frequency equal to the input signal frequency f.

The operation principle of the frequency detection device 100 of the present invention will be described as follows. Please refer to FIG. 1. The conduction status of the first transistor 1044 in the frequency-voltage conversion unit 104 is determined pursuant to the input signal $S_{PFM}$; and the conduction status of the second transistor 1048 in the frequency-voltage conversion unit 104 is determined pursuant to the inverted input signal $\overline{S}_{PFM}$. Therefore, the operation of the frequency-voltage conversion unit 104 may be separated into two phases. In the first phase, the input signal $S_{PFM}$ is logic low '0', the inverted input signal $\overline{S}_{PFM}$ is logic high '1', the first transistor 1044 is turned off, and the second transistor 1048 is turned on; meanwhile, the charging operation performed upon the capacitor 1042 by the constant current $I_{total}$ may be expressed as follows:

$$I_{total} = C_1 \frac{dv}{dt} \Rightarrow \int_0^{V_1} dv = \frac{I_{total}}{C_1} \int_0^{\frac{1}{2f}} dt \Rightarrow V_1 = \frac{I_{total}}{C_1} \frac{1}{2f} \tag{2}$$

where $V_1$ is the increased voltage across the capacitor 1042, and f is the frequency of the input signal $S_{PFM}$ and the inverted input signal $\overline{S}_{PFM}$.

In the second phase, the input signal $S_{PFM}$ is logic high '1', the inverted input signal $\overline{S}_{PFM}$ is logic low '0', the first transistor 1044 is turned on, and the second transistor 1048 is turned off. Since the first transistor 1044 is turned on, the charge sharing effect is induced around the first and the second capacitors 1042 and 1046. The derivations concerned may be expressed as follows:

$$V_1 C_1 = V_x(C_1 + C_2) \Rightarrow V_X = \frac{C_1}{C_1 + C_2} V_1 \quad (3)$$

where $V_x$ is the decreased voltage across the capacitor 1046, which is a result of the charge sharing effect.

Therefore, in the second phase, the charging operation performed upon the capacitor 1042 by the constant current $I_{total}$ may be expressed as follows:

$$I_{total} = \quad (4)$$
$$(C_1 + C_2)\frac{dv}{dt} \Rightarrow \int_{V_x}^{v_2} dv = \frac{I_{total}}{C_1 + C_2} \int_{\frac{1}{2f}}^{\frac{1}{f}} dt \Rightarrow V_2 - V_x = \frac{I_{total}}{C_1 + C_2} \frac{1}{2f}$$

$$V_2 = V_x + \frac{I_{total}}{C_1 + C_2} \frac{1}{2f} = \frac{C_1}{C_1 + C_2} V_1 + \frac{I_{total}}{C_1 + C_2} \frac{1}{2f} \quad (5)$$

where $V_2$ is the increased voltage across the capacitor 1042 during the period of the second phase.

Since the first phase and the second phase will continue to repeat, it can be assumed that:

$$\beta = \frac{C_1}{C_1 + C_2}$$

$$V_C = \frac{I_{total}}{C_1 + C_2} \frac{1}{2f}$$

Thus, the voltage output $V_{out}$ of the voltage output terminal $N_{out}$ of the frequency-voltage conversion unit 104 can be obtained through the following deductions:

$$V_{2n} = (\beta V_1 + V_{out})(\beta^{n-1} + \beta^{n-2} + \ldots + 1) \Rightarrow V_{out} = \frac{I_{total}}{fC_2} \quad (6)$$

Further, the relation of the control current I and the voltage output $V_{out}$ can be expressed as:

$$I = \frac{V_{out}}{R} \rightarrow I_{total} = \frac{V_2}{R} \quad (7)$$

The signal frequency f of the input signal $S_{PFM}$ and the inverted input signal $\overline{S}_{PFM}$ can be derived by combining the equations (6) and (7), and is expressed as:

$$f = \frac{V_2}{RC_2 V_{out}}, \quad (8)$$
or
$$V_{out} = \frac{V_2}{fRC_2} \quad (9)$$

Wherein if the voltage output $V_{out}$ and the increased voltage $V_2$ across the capacitor 1042 are both fixed, and the signal frequency f relates to $RC_2$, thus the signal frequency f of the input signal $S_{PFM}$ and the inverted input signal $\overline{S}_{PFM}$ can be derived precisely when $RC_2$ is processed, for example, by a calibration process. In other words, the voltage output $V_{out}$ of the voltage output terminal $N_{out}$ of the frequency-voltage conversion unit 104 is inversely proportional to the input signal frequency f of the input signal $S_{PFM}$, that is to say, the higher is the signal frequency f of the input signal $S_{PFM}$, the lower the voltage output $V_{out}$ of the voltage output terminal $N_{out}$ is. And the voltage output $V_{out}$ of the voltage output terminal $N_{out}$ of the frequency-voltage conversion unit 104 is inversely proportional to the value of R or $C_2$.

When the signal frequency f of the input signal $S_{PFM}$ becomes higher and higher, switching the modulation mode from PFM to PWM would reduce the overall power consumption and improves the overall modulation efficiency. In this embodiment, the voltage output $V_{out}$ of the voltage output terminal $N_{out}$ of the frequency-voltage conversion unit 104 may be utilized to judge how fast the input signal frequency f is. For instance, a predetermined frequency $f_{pd}$ may be defined in advance, and then the modulation mode could be switched from PFM to PWM once the input signal frequency f of the input signal $S_{PFM}$ exceeds the predetermined frequency $f_{pd}$. Therefore, a corresponding predetermined voltage $V_{pd}$ can be derived by equation (9). The comparator 106 is used to compare the voltage output $V_{out}$ with the predetermined voltage $V_{pd}$. When the voltage output $V_{out}$ decreases to a level lower than the predetermined voltage $V_{pd}$, an output of the comparator 106 has a transition from logic high '1' to logic low '0', thereby instructing associated control and modulation circuits to switch from PFM to PWM.

Figure 2:
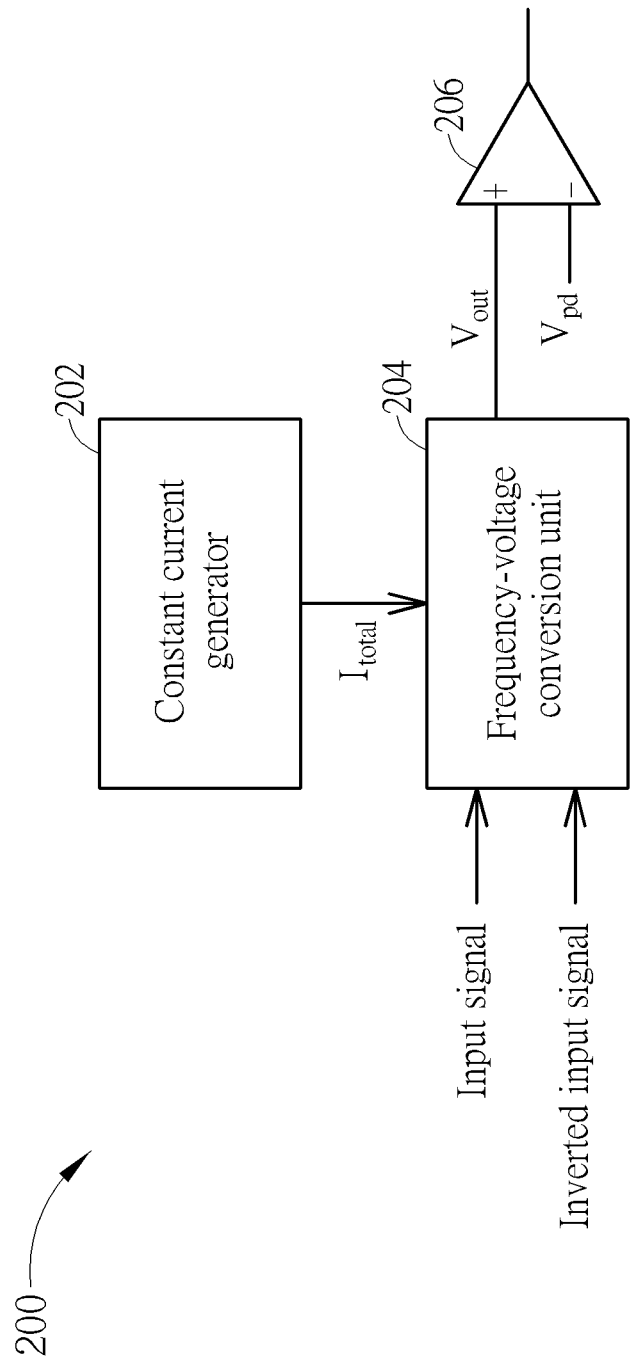
FIG. 2 is a diagram illustrating a frequency detection apparatus according to an embodiment of the present invention.

Please note that the above descriptions regarding an embodiment of the present invention are for illustrative purposes only. In practice, any alternative designs and modifications capable of achieving the same objective fall within the scope of the present invention. Please refer to FIG. 2, which is a diagram illustrating a frequency detection apparatus 200 according to an embodiment of the present invention. The frequency detection apparatus 200 includes a constant current generator 202, a frequency-voltage conversion unit 204 and a comparator 106. The constant current generator 202 is arranged for providing a constant current $I_{total}$ to a voltage output terminal of the frequency-voltage conversion unit 204. The frequency-voltage conversion unit 204 generates a voltage output $V_{out}$ at a voltage output terminal in accordance with the input signal, the inverted input signal and the constant current $I_{total}$, wherein the inverted input signal is an inverted version of the input signal. The comparator 106 has a first input terminal (+) and a second input terminal (−), wherein the first input terminal (+) is coupled to the voltage output terminal, and the second input terminal (−) is coupled to a predetermined voltage $V_{pd}$ corresponding to a predetermined frequency $f_{pd}$. The comparator 106 is utilized to determine whether the input signal frequency f of the input signal exceeds the predetermined frequency $f_{pd}$. In this embodiment, the circuit architecture of the frequency-voltage conversion unit 204 in the frequency detection apparatus 200 may be different from that of the frequency-voltage conversion unit 104. More specifically speaking, the spirit of the present invention is obeyed as long as there is a predetermined proportion relationship between the voltage at the output terminal of the frequency-voltage conversion unit 204 and the frequency of the output signal of the frequency-voltage conversion unit 204.

In summary, the disclosed frequency detection apparatus may be used to control the signal processing modules by detecting the frequency variation. For instance, the frequency detection apparatus 100/200 can detect the frequency of the input signal to automatically control the switching between PFM and PWM without detecting the voltage load of components other than core components, which is efficient and power saving. To put it another way, the frequency detection apparatus of the present invention prolongs the battery life in portable devices, and has less power consumption and heat dissipation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency detection apparatus, comprising:
 a constant current generator, arranged for providing a constant current to a voltage output terminal;
 a first capacitor, coupled between the voltage output terminal and a first reference voltage;
 a first transistor, having a first connection terminal, a control terminal, and a second connection terminal, wherein the first connection terminal of the first transistor is coupled to the voltage output terminal, and the control terminal of the first transistor is coupled to an input signal;
 a second capacitor, coupled between the second connection terminal of the first transistor and the first reference voltage; and
 a second transistor, having a first connection terminal, a control terminal, and a second connection terminal, wherein the first connection terminal of the second transistor is coupled to the second connection terminal of the first transistor, the second connection terminal of the second transistor is coupled to the first reference voltage, and the control terminal of the second transistor is coupled to an inverted input signal;
 wherein a voltage output of the voltage output terminal changes along with an input signal frequency of the input signal, and the constant current generator comprises:
  a first resistor, coupled between a second reference voltage and the voltage output terminal;
  a third transistor, having a first connection terminal, a control terminal and a second connection terminal, wherein the first connection terminal is coupled to the voltage output terminal, and the second connection terminal is coupled to the second reference voltage;
  a fourth transistor, having a first connection terminal, a control terminal and a second connection terminal, wherein the first connection terminal of the fourth transistor is coupled to the control terminal of the third transistor and the control terminal of the fourth transistor, and the second connection terminal of the fourth transistor is coupled to the second reference voltage;
  a fifth transistor, having a first connection terminal, a control terminal and a second connection terminal, wherein the first connection terminal of the fifth transistor is coupled to the first connection terminal of the fourth transistor;
  an amplifier, having a positive input terminal, a negative input terminal and an output terminal, wherein the positive input terminal is coupled to the voltage output terminal, the negative input terminal is coupled to the second connection terminal of the fifth transistor, and the output terminal is coupled to the control terminal of the fifth transistor; and
  a second resistor, coupled between the second connection terminal of the fifth transistor and the first reference voltage.

2. The frequency detection apparatus of claim 1, wherein the voltage output of the voltage output terminal is inversely proportional to the input signal frequency of the input signal.

3. The frequency detection apparatus of claim 1, further comprising:
 a comparator, having a first input terminal and a second input terminal, wherein the first input terminal is coupled to the voltage output terminal, and the second input terminal is coupled to a predetermined voltage corresponding to a predetermined frequency;
 wherein the comparator is arranged to determine whether the input signal frequency of the input signal exceeds the predetermined frequency.

4. The frequency detection apparatus of claim 1, wherein the input signal is a pulse frequency modulation (PFM) signal outputted by a modulation unit which performs a pulse frequency modulation.

5. The frequency detection apparatus of claim 1, wherein the voltage output of the voltage output terminal is inversely proportional to a value of the second capacitor.

6. A frequency detection apparatus, comprising:
 a constant current generator, arranged for providing a constant current to a voltage output terminal, wherein the constant current generator comprises:
  a first resistor, coupled between a second reference voltage and the voltage output terminal;
  a first transistor, having a first connection terminal, a control terminal and a second connection terminal, wherein the first connection terminal is coupled to the voltage output terminal, and the second connection terminal is coupled to the second reference voltage;
  a second transistor, having a first connection terminal, a control terminal and a second connection terminal, wherein the first connection terminal of the second transistor is coupled to the control terminal of the first transistor and the control terminal of the second transistor, and the second connection terminal of the second transistor is coupled to the second reference voltage;
  a third transistor, having a first connection terminal, a control terminal and a second connection terminal, wherein the first connection terminal of the third transistor is coupled to the first connection terminal of the second transistor;
  an amplifier, having a positive input terminal, a negative input terminal and an output terminal, wherein the positive input terminal is coupled to the voltage output terminal, the negative input terminal is coupled to the second connection terminal of the third transistor, and the output terminal is coupled to the control terminal of the third transistor; and
  a second resistor, coupled between the second connection terminal of the third transistor and the first reference voltage; and
 a frequency-voltage conversion unit, arranged for receiving an input signal, an inverted input signal and the constant current, and generating a voltage output at the voltage output terminal according to the input signal, the inverted input signal and the constant current;
 wherein there is a predetermined proportion relationship between the voltage output and an input signal frequency of the input signal.

7. The frequency detection apparatus of claim 6, wherein the predetermined proportion relationship is an inverse proportion relationship.

8. The frequency detection apparatus of claim 6, further comprising:

a comparator, having a first input terminal and a second input terminal, wherein the first input terminal is coupled to the voltage output terminal, and the second input terminal is coupled to a predetermined voltage corresponding to a predetermined frequency;

wherein the comparator is arranged to determine whether the input signal frequency of the input signal exceeds the predetermined frequency.

9. The frequency detection apparatus of claim 6, wherein the input signal is a pulse frequency modulation (PFM) signal outputted by a modulation unit which performs a pulse frequency modulation.

* * * * *